(12) United States Patent
Hougham et al.

(10) Patent No.: US 7,736,152 B2
(45) Date of Patent: Jun. 15, 2010

(54) LAND GRID ARRAY FABRICATION USING ELASTOMER CORE AND CONDUCTING METAL SHELL OR MESH

(75) Inventors: Gareth G. Hougham, Ossining, NY (US); Keith E. Fogel, Mohegan Lake, NY (US); Paul A. Lauro, Brewster, NY (US); Joseph Zinter, Jr., Brewster, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/249,035

(22) Filed: Oct. 10, 2008

(65) Prior Publication Data

US 2009/0042414 A1 Feb. 12, 2009

Related U.S. Application Data

(62) Division of application No. 10/531,494, filed on Apr. 15, 2005, now Pat. No. 7,479,014.

(60) Provisional application No. 60/421,480, filed on Oct. 24, 2002.

(51) Int. Cl.
*H01R 12/00* (2006.01)
(52) U.S. Cl. ............................. 439/66; 439/86; 439/931
(58) Field of Classification Search .................. 439/65, 439/66, 74, 86, 91, 591, 886, 931
See application file for complete search history.

(56) References Cited

U.S. PATENT DOCUMENTS 4,070,077 A * 1/1978 Clark .......................... 439/876
4,181,385 A * 1/1980 DeSantis et al. .............. 439/83
4,813,129 A    3/1989 Karnezos
5,599,193 A    2/1997 Crotzer (Continued)

FOREIGN PATENT DOCUMENTS

JP        02-043558        2/1990

(Continued)

OTHER PUBLICATIONS

"Metallized Elastomeric Bumps for Chip and Zero Insertion Force Connectors", IBM Technical Disclosure Bulletin, IBM Corp., New York, vol. 37, No. 9; Sep. 1, 1994, p. 625 (XP 000475526).

*Primary Examiner*—James Harvey
(74) *Attorney, Agent, or Firm*—Scully, Scott, Murphy & Presser, P.C.; Daniels P. Morris, Esq.

(57) ABSTRACT

Methods for fabricating Land Grid Array (LGA) interposer contacts that are both conducting and elastic. Also provided are LGA interposer contacts as produced by the inventive methods. Provided is LGA type which utilizes a pure unfilled elastomer button core that is covered with an electrically-conductive material that is continuous from the top surface to the bottom surface of the button structure. In order to obviate the disadvantages and drawbacks which are presently encountered in the technology pertaining to the fabrication and structure of land grid arrays using electrically-conductive interposer contacts, there is provided both methods and structure for molding elastomer buttons into premetallized LGA carrier sheets, and wherein the non-conductive elastomer buttons are surface-metallized in order to convert them into conductive electrical contacts.

1 Claim, 15 Drawing Sheets

U.S. PATENT DOCUMENTS

| | | |
|---|---|---|
| 5,624,268 A | 4/1997 | Maeda et al. |
| 6,046,410 A | 4/2000 | Wojnarowski et al. |
| 6,224,394 B1 * | 5/2001 | Matsumoto ................... 439/66 |
| 6,814,584 B2 * | 11/2004 | Zaderej ....................... 439/66 |
| 7,070,419 B2 | 7/2006 | Brown et al. |
| 7,113,408 B2 | 9/2006 | Brown et al. |
| 7,137,827 B2 | 11/2006 | Hougham et al. |
| 2002/0022383 A1 | 2/2002 | Sakata et al. |
| 2006/0003648 A1 | 1/2006 | Hougham et al. |

FOREIGN PATENT DOCUMENTS

| | | |
|---|---|---|
| JP | 08-287983 | 11/1996 |
| JP | 08-306416 | 11/1996 |
| JP | 2000-315533 | 11/2000 |
| WO | WO 01/89038 A2 | 11/2001 |

* cited by examiner

LAND GRID ARRAY FABRICATION USING ELASTOMER CORE AND CONDUCTING METAL SHELL OR MESH

CROSS REFERENCE TO RELATED APPLICATIONS

The present application is a divisional application of U.S. patent application Ser. No. 10/531,494, filed Apr. 15, 2005 now U.S. Pat. No. 7,479,014, which claims the benefit of U.S. Provisional Patent Application No. 60/421,480; filed on Oct. 24, 2002.

BACKGROUND OF THE INVENTION

1. Field of the Invention

This invention relates to novel and unique methods for fabricating Land Grid Array (LGA) interposer contacts that are both conducting and elastic. Furthermore, the invention also pertains to LGA interposer contacts as produced by the inventive methods.

2. Discussion of the Prior Art

LGA interposers provide in general, interconnections between a multi-chip module (MCM) and a printed wiring board (PWB). A general example of an LGA retained in position between a module and a PWB is shown in the drawings, whereby LGAs may accommodate very dense two-dimensional (2-D) arrays of I/Os, and are currently being employed in the highest-end server and supercomputer products.

One widely commercially available LGA uses button contacts each consisting of siloxane rubber filled with silver particles, such as shown in FIG. 1 of the drawings. This structure is intended to provide a contact which possesses a rubber-like elasticity with the provision of an electrical conductivity. While siloxane itself has very desirable properties for this type of application, incorporating both a low elastic modulus and high elasticity, the particle-filled siloxane rubber system loses a significant proportion of these desirable properties under the loadings which are required for electrical conductivity. Although the modulus increases, it remains low overall and requires only about 30 to 80 grams per contact to ensure good electrical reliability; however, the loss of elasticity, results in severe creep deformation under constant load and stress relaxation under constant strain. These tendencies render electrically conductive elastomer LGAs unreliable for high end products which require an extraordinary stability over a lengthy period of time. Indeed, modern high end server CPUs demand LGA failure rates at ppb levels on a per contact basis because of a total system dependence on individual signal contacts.

Because of the adverse extent of creep and stress relaxation which has been demonstrated by the filled electrically-conductive elastomer LGAs of the prior art, the industry presently favors the use of LGA arrays which are fabricated from random coil springs, such as, for instance, a product called the Cinch connector which is made by the Synapse company. These springs have a much higher spring constant than the electrically-conductive elastomer type, and require pressures of upwards of 120 grams per contact in order to ensure reliable electrical connection across the array. These forces combine across a multichip module (MCM) with more than 7000 I/Os to resultingly require nearly a ton of continuously applied force over the area of a 4×4 inch module. These high forces can deform ceramic modules, reducing their planarity which can result in cracked die, broken C4 connections, and loss of thermal conductivity to the heatsink by introducing defects in normally employed thermal paste.

There is a strong technical motivating factor for using LGAs instead of rigid direct solder attachments between module and printed wiring board. The lateral stresses that occur due to TCE (thermal coefficient of expansion) mismatches between ceramic modules and organic PWBs are large, and direct ball grid array type connections often tend to fail. Systems are accordingly preferred which have some built in lateral compliance. One direct attach solution to address that problem is the so called "column grid array" or CGA. The CGA is a permanent solder type interconnect that deforms without failing in order to accommodate the lateral stresses imposed.

There is also present a strong economic motivating factor for using LGA interposers over direct attach solutions. This is because repairs and upgrades to chipsets cannot be carried out in the field with direct attach solutions. Pressure mounted LGAs can be replaced in the field, thereby saving the customer significant costs in disassembly, shipping, and rework down-time.

Thus, there are both technological and economic advantages to the pressure applied type LGA interposer approach. No current solutions provide a reliable connection that is either scalable to larger I/O counts or to more fragile organic chip module systems.

Accordingly, the present invention is directed to the provision of a device type and methods of fabrication that fulfills the combined requirements of adequate long term reliability, low contact force, and field replacablity.

SUMMARY OF THE INVENTION

The invention essentially describes an LGA type which utilizes a pure unfilled elastomer button core that is covered with an electrically-conductive material that is continuous from the top surface to the bottom surface of the button structure.

In order to obviate the disadvantages and drawbacks which are presently encountered in the technology pertaining to the fabrication and structure of land grid arrays using electrically-conductive interposer contacts, pursuant to the invention there is provided both methods and structure for molding elastomer buttons into premetallized LGA carrier sheets, and wherein the non-conductive elastomer buttons are surface-metallized in order to convert them into conductive electrical contacts.

Concerning the foregoing, pursuant to an aspect of the invention there is provided for the metallization of an array of through holes formed in an interposer carrier sheet, the latter of which is preferably a plastic or polyimide LGA carrier, which may be fabricated through the intermediary of masking procedures, with a development of photoresist, and thereafter molding elastomer buttons into the metallized through-holes, with the elastomer buttons being constituted of an essentially non-conductive or dielectric resilient material. Thereafter, the elastomer buttons are metallized, preferably through physical masking in order to provide electrically conductive surface structure communicating with circuitry or electronic components on the carrier sheet or sheets on which they are mounted.

Pursuant to other features of the invention, there are provided arrays of contact holes, produced by the aforedescribed methods which are filled with elastomer and which are then metallized in different metallizing patterns pursuant to particular requirements, and wherein there may also be provided vertical unmetallized holes to allow for optical pathways for vertical cavity lasers in lieu of metallization of the through-holes.

Also described is a structure comprising physical masks which are utilized to enable the metallization of the interposer buttons in diverse patterns in conformance with specific physical applications and industrial requirements.

Accordingly, it is an object of the present invention to provide a method for land grid array fabrication employing a dielectric elastomer core and electrically-conducting metal shells or mesh structure to resultingly produce an interposer for electrical connects.

Another object of the invention is to provide a method for the fabricating of land grid arrays interposer contacts which are both electrically conductive and elastic or resilient in their physical properties.

Yet another object of the present invention is to provide an LGA type structure which utilizes a pure dielectric elastomer button core covered with a conductive material so as to provide an electrical pathway between a printed wiring board and electronic components.

BRIEF DESCRIPTION OF THE ACCOMPANYING DRAWINGS

Reference may now be made to the following detailed description of preferred embodiments of the invention, taken in conjunction with the accompanying drawings; which:

DETAILED DESCRIPTION OF PREFERRED EMBODIMENTS

Reference may now be made to drawing FIG. 1 which in more specific detail illustrates a modular arrangement 10 for the positioning or retention of a land grid array (LGA) in place between a multi-chip module (MCM) 14 and a printed wiring board (PWB) 16.

Figure 1A:
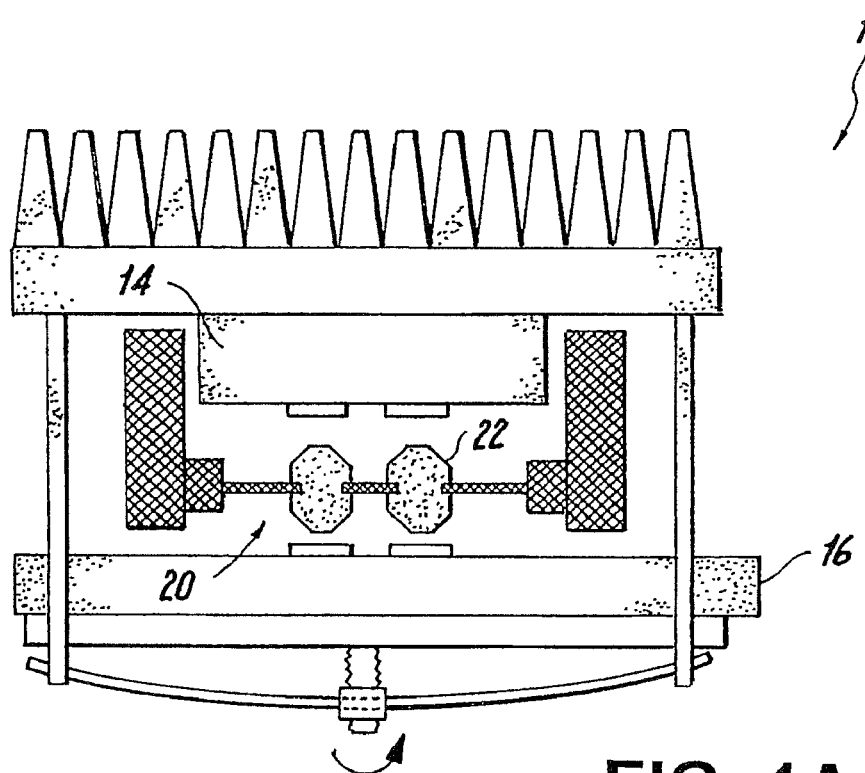
FIG. 1A illustrates a diagrammatic cross-sectional view of a module assembly utilizing a pressure applied LGA produced in accordance with the prior art.

As indicated in cross-sectional view, this illustrates the module assembly 10 utilizing a pressure applied LGA interposer 20 wherein the electrically conductive buttons and contacts 22 which are constituted of siloxane are employed as in the prior art. In that instance, as also indicated in FIG. 1A of the drawings, the siloxane type button contact 22 utilizes siloxane material with a filler of silver particles mixed in above the percolation threshold for electrical conductivity. In contrast with the foregoing, the present application is directed to a button type consisting of a dielectric elastomer without the filler, but in lieu thereof providing electrically conductive material deposited on the outer surface of the interposer button 22, although the general module assembly is consistent with the use of the hereindescribed LGA interposer type.

Figure 1B:
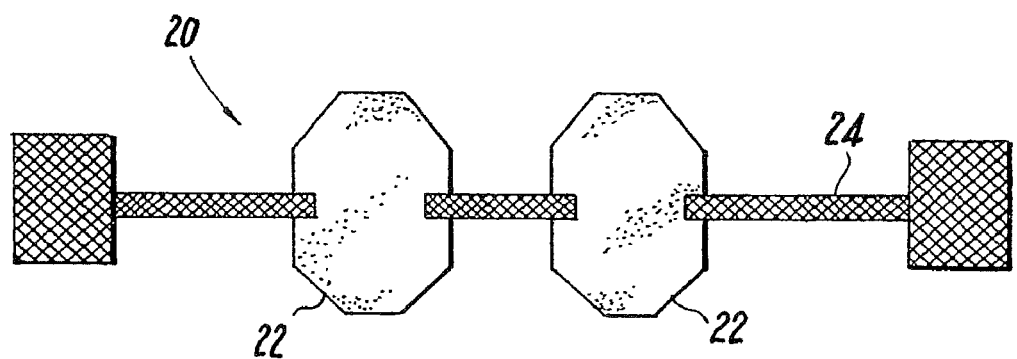
FIG. 1B illustrates an enlarged detailed representation of the interposer portion of FIG. 1A.

As shown in FIG. 1B, the carrier sheet 24 which may be utilized for the printed wiring board (PWB) 16 may be constituted of Kapton or many other suitable materials, whereas the interposer contact buttons 22 are filled with silver and are constituted of siloxane.

Although only two buttons are shown for purpose of illustration, generally the carrier sheet 24 may comprise an array of possibly 40 or more such electrically conductive buttons 22 for the purpose of contacting the multichip modules and printed circuit boards.

As illustrated in FIG. 2A through 2E of the drawings, there is illustrated a basic flow method or process for metallizing through-holes in an interposer carrier sheet 30.

Figure 2A:
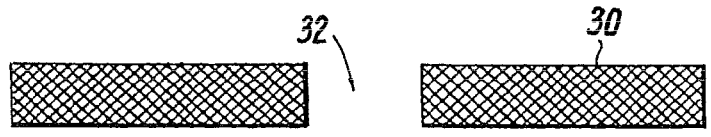
FIGS. 2A through 2E represent basic process steps for metallizing a through-hole in an interposer carrier sheet.

As shown in FIG. 2A the carrier sheet 30 may be an LGA carrier constituted of plastic or polyimide having at least one through-hole 32 formed therein. In actuality there are provided an array of through-holes, however, for purposes of clarity only a single hole 32 is described herein.

Figure 2B:
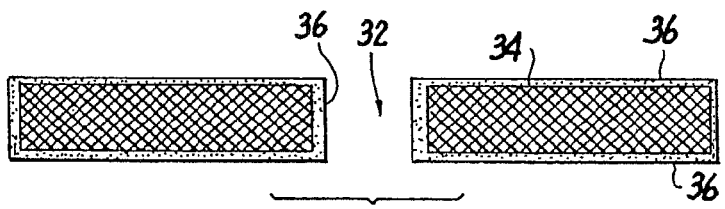

Referring to FIG. 2B, the hole 32 and carrier sheet surface 34 is plated or otherwise coated with metallic material 36 on both sides thereof, and in a continuous manner from one side, through the through-hole, to the other side.

Figure 2C:
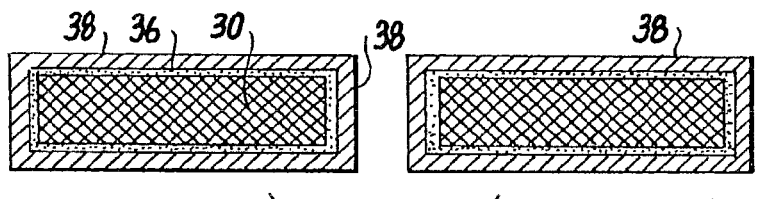
Figure 2D:
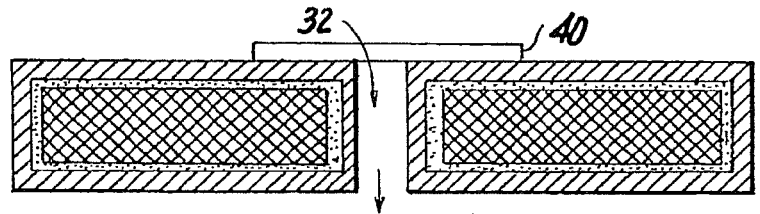

Thereafter, as illustrated in FIG. 2C, photoresist 38 is plated on all surfaces; and then as shown in FIG. 2D, a mask 40 of circular pattern concentrically placed over holes 32. One side is then exposed to UV light. The mask 40 is then removed, and the assembly flipped and the mask replaced on the second side of the carrier sheet over the holes, and thereafter the second side thereof is exposed to UV light.

Figure 2E:
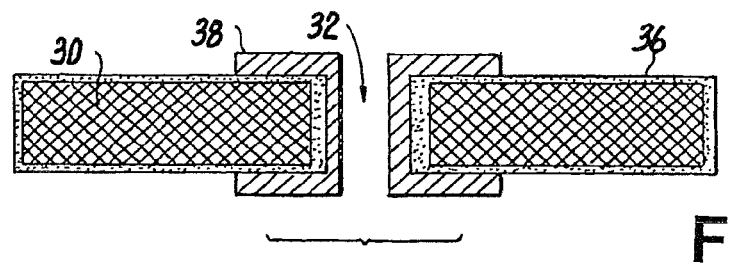

In actuality the photoresist 38 can then be developed on both sides of the carrier sheet simultaneously to provide the arrangement shown in FIG. 2E of the drawings, representing the plastic carrier sheet coated with the metal externally and the photoresist extending over the walls of the through-holes 32.

Figure 3A:
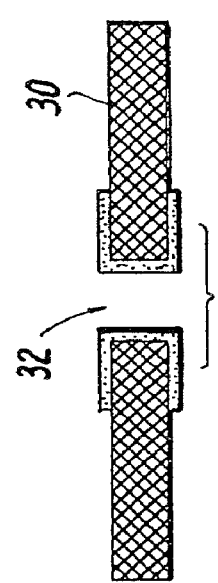
FIGS. 3A and 3B illustrate, respectively, a basic method of molding steps in an elastomer button into a premetallized LGA carrier sheet.
Figure 3B:
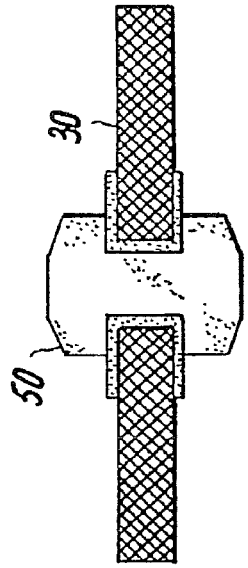

FIG. 3A shows the metallized through-hole 32 whereby the photoresist 38 has been stripped off the surface of the carrier sheet; and in FIG. 3B the molded elastomer button 50 is inserted and docked into the metallized hole 32 of the carrier sheet. The non-button or pad areas have been masked, and then sputtered or coated with conductive metallic materials, and thereafter a electrolessly-plated metal shell is formed over the elastomer button 50, as described hereinbelow.

Figure 4A:
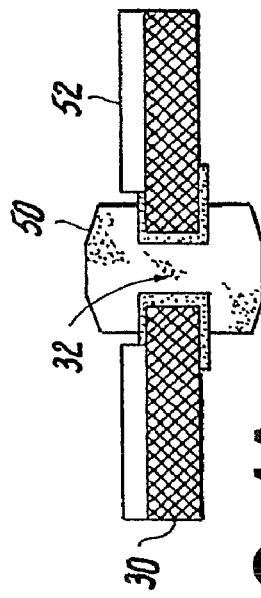
FIGS. 4A through 4D illustrate steps in a method of metallizing elastomer buttons so as to become a conductive electrical contact.

As shown in FIG. 4A which is a modification of FIGS. 3A and 3B an evaporation mask 52 is positioned on the carrier sheet surface, which comprises a planar structure with through-holes 32 and with the buttons 50 extending through the holes in self-alignment.

Figure 4B:
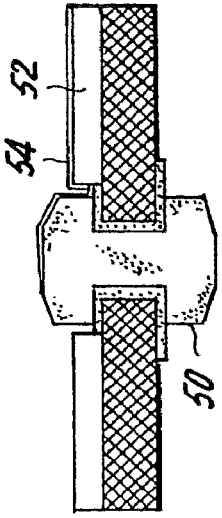

As shown in FIG. 4B, an evaporated, sputtered or sprayed metal coating 54 is provided on the surface of the projecting button 50 and on the evaporation mask 52. Such metal coating may be nickel coating, or copper or of titanium alloy which is super elastic, although other elastic metals, such as gold and the like would also be applicable to the foregoing procedure.

Figure 4C:
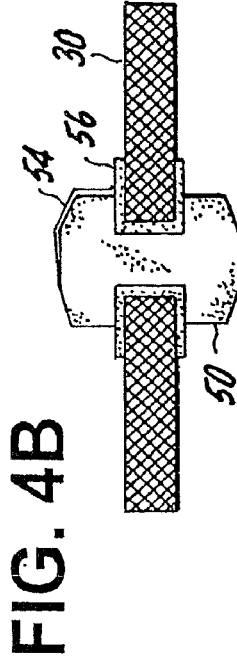

As indicated in FIG. 4C the mask 52 is then lifted away from the carrier sheet leaving the coating 54 only on the button surface contacting through the through-holed pad 56.

Figure 4D:
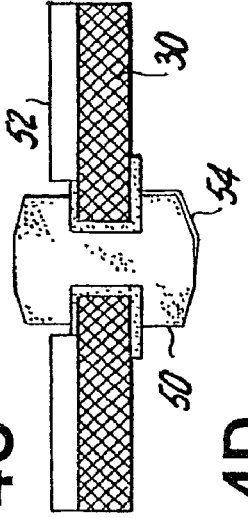

In the illustration of FIG. 4D, the arrangement is inverted, and the mask 52 applied to the opposite side and the metallization process is repeated as heretofore.

Figure 5A:
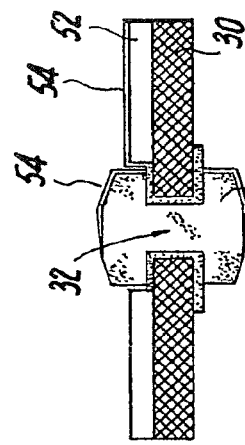
FIGS. 5A and 5B illustrate, respectively, further method steps to metallize the opposite side of the LGA interposer.
Figure 5B:
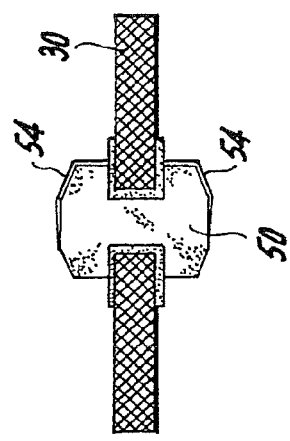

The foregoing is also illustrated in FIGS. 5A and 5B of the drawings, wherein in FIG. 5A, sputter-deposited metal is provided on the opposite sheet side and on the mask 52 and elastomer button 50, and the mask is then lifted away, as shown in FIG. 5B, to reveal the finished LGA arrangement including the metallized interposer or button.

Figure 6A:
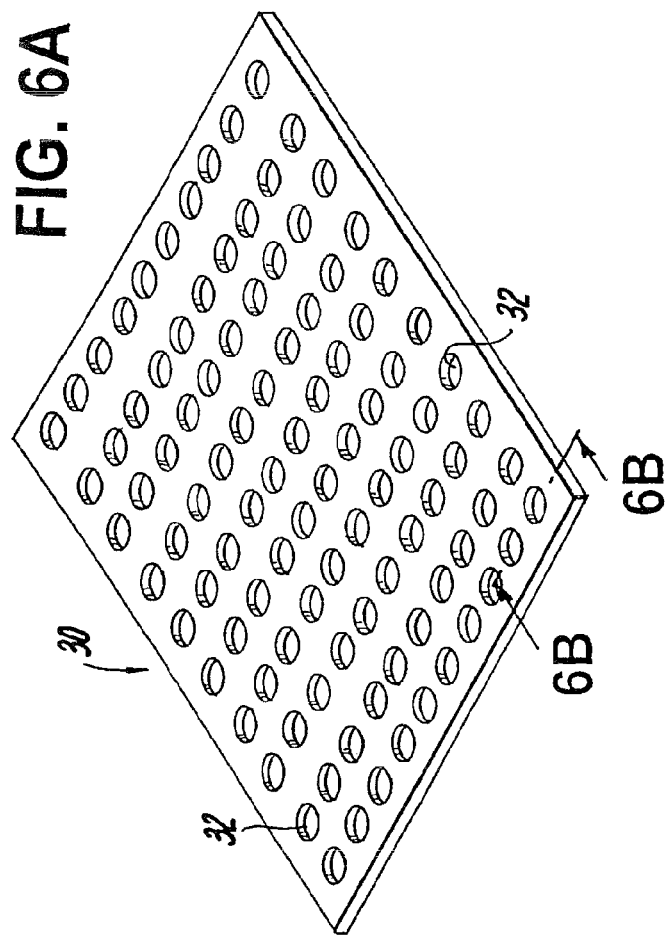
FIG. 6 illustrates a perspective view of a plastic or polyimide carrier sheet as in FIG. 2A.
Figure 6B:
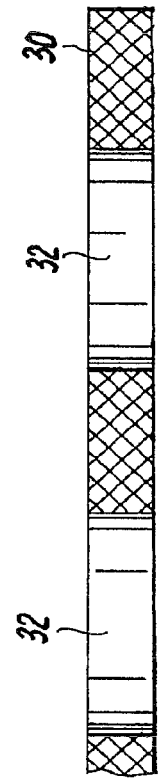

FIG. 6A illustrates a perspective representation of the plastic or polyimide carrier sheet having an array of the through-holes 32 as previously described, while in FIG. 6B there is shown a cross-sectional view, on an enlarged scale, of two of the contact holes 32 in the empty interposer carrier sheet 30.

Figure 7:
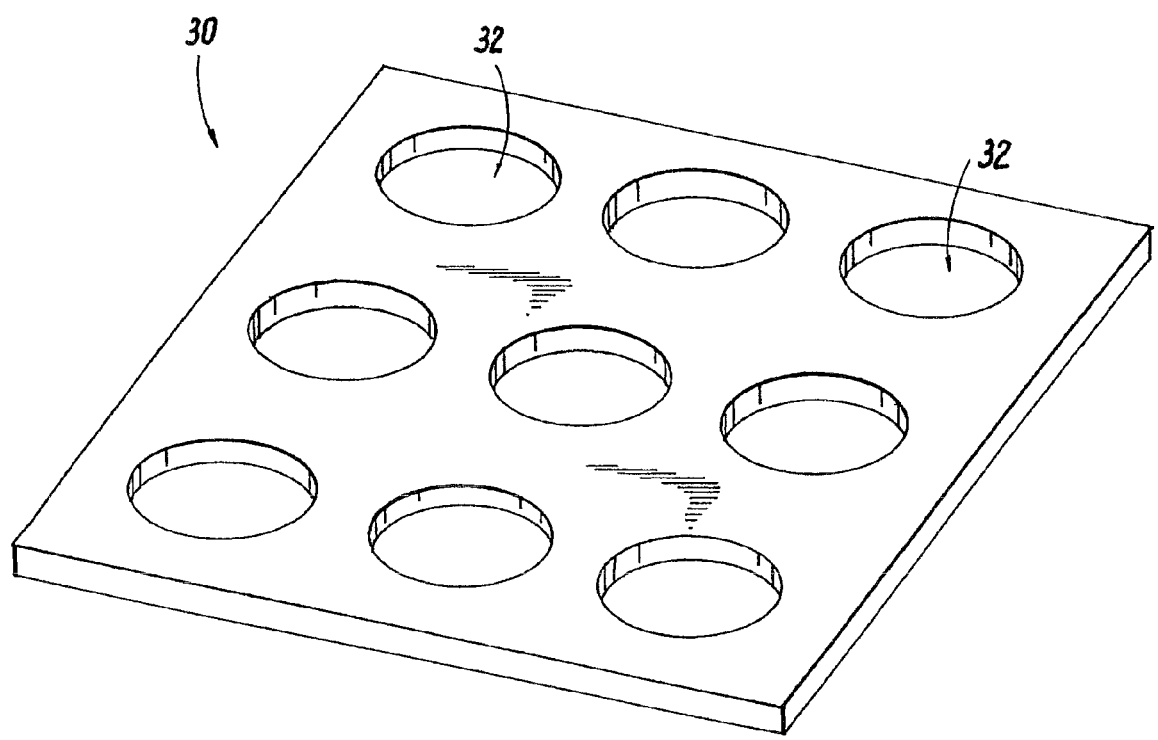
FIG. 7 illustrates a further perspective view of the carrier sheet of FIG. 2A.
Figure 8A:
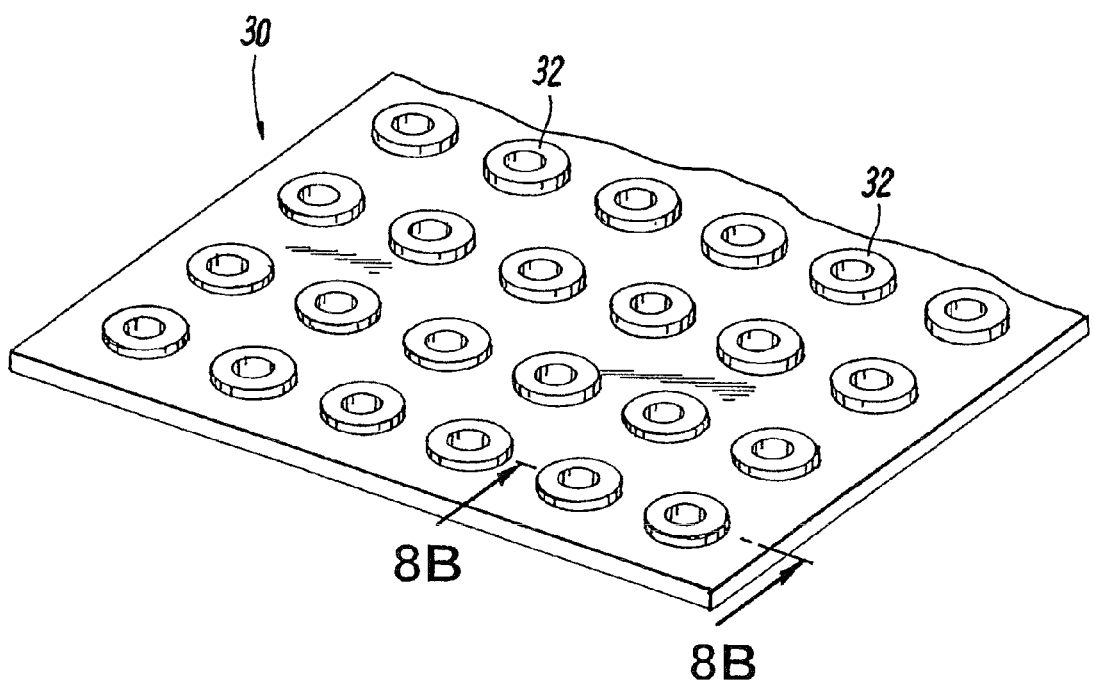
FIG. 8A illustrates perspective representation of the carrier sheet as in FIG. 2E.
Figure 8B:
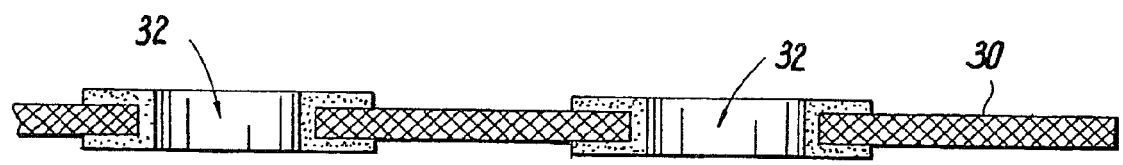
FIG. 8B illustrates, on an enlarged scale, a diagrammatic sectional representation through two of the metallized through-holes formed in the carrier sheet of FIG. 8A.

As shown in FIG. 7 there is shown diagrammatically the interposer carrier sheet 30 corresponding to FIG. 2A; also in FIG. 8A there is shown a perspective view corresponding to FIG. 2A of the sheet; and in FIG. 8B, on an enlarged scale, a transverse sectional view through two plated-through holes 32.

Figure 9A:
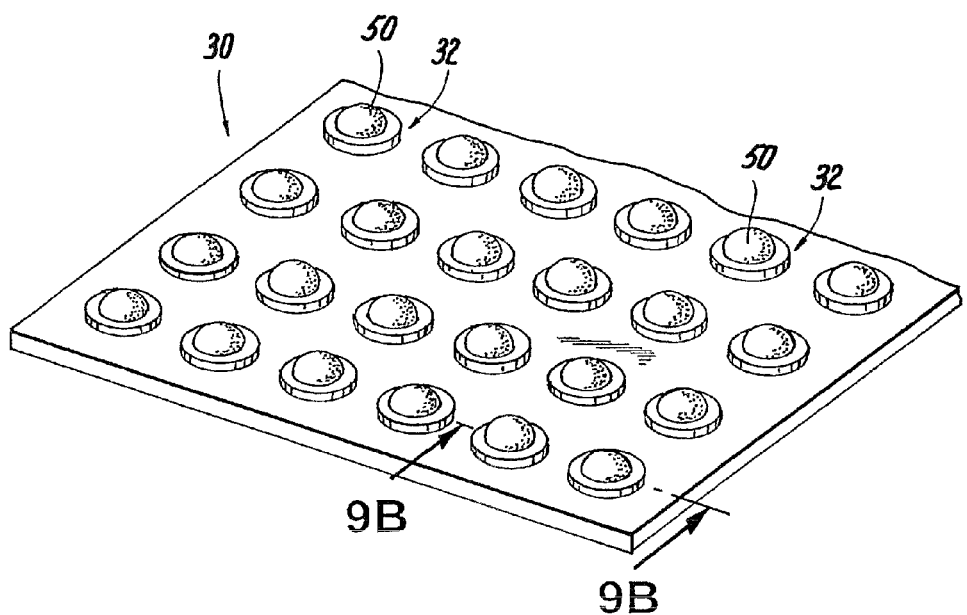
FIG. 9A illustrates a perspective view of the interposer carrier sheet similar to that of FIG. 3B.
Figure 9B:
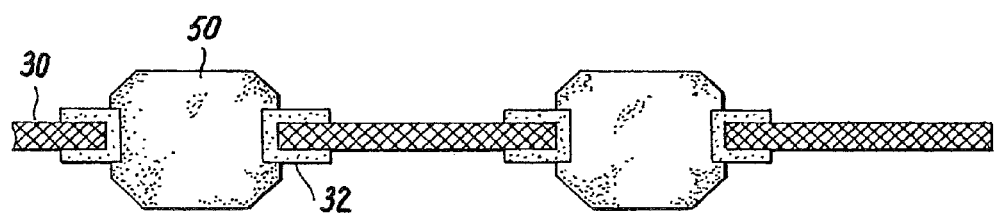
FIG. 9B illustrates, on an enlarged scale, a sectional view through two of the contact holes filled with elastomer buttons or interposers to form eventually two contacts.
Figure 10:
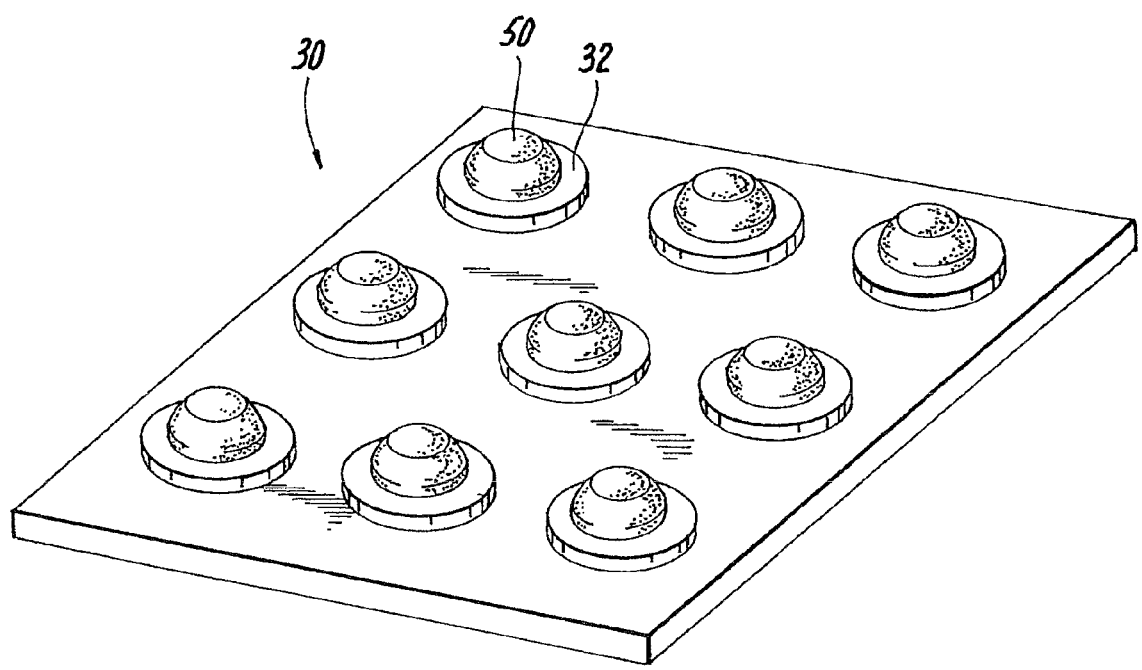
FIG. 10 illustrates a perspective view somewhat similar to FIG. 3B.

Illustrated in FIGS. 9A and 9B, which correspond to FIG. 3B, are a perspective view of the interposer carrier sheet 30 with the contact holes 32 filled with elastomer buttons 50, prior to metallization thereof; and wherein in FIG. 9B there are represented two of the contacts with the interposer formed of the elastomer material prior to metallization. This is also pictorially represented in FIG. 10 of the drawings, which essentially corresponds to FIG. 3B.

FIGS. 11A through 11G illustrate various patterns of metallized siloxane button contacts subsequent to final fabrication, which metallization pattern are basically non-continuous. As shown in FIG. 11A through 11H various patterns of metallization strips are coated onto the surface of the siloxane or plastic button contacts 50; whereas in FIG. 11G there is illustrated a full metal cap 60 provided over the surface of the plastic buttons 50 or interposer structures.

Figure 11A:
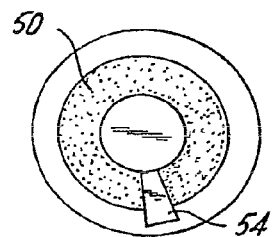
FIGS. 11A through 11H represent various metallization patterns formed on the interposer or plastic buttons, as described hereinabove.
Figure 11B:
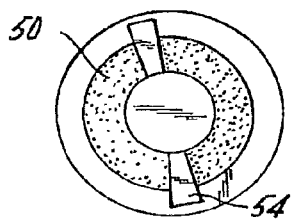
Figure 11C:
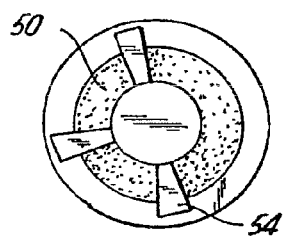
Figure 11D:
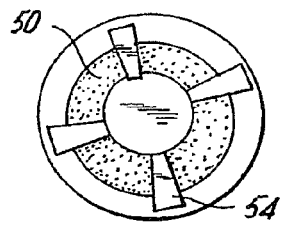
Figure 11E:
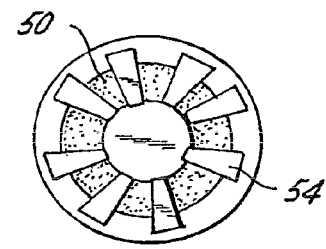
Figure 11F:
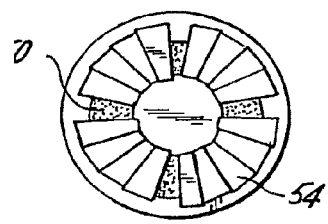
Figure 11G:
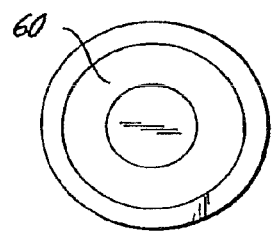
Figure 11H:
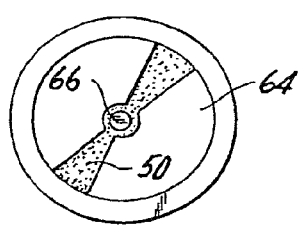

In FIG. 11H there is provided a specialized cap design 64 with an unmetallized center hole 66 to facilitate the formation of optical pathways, for instance, in which a vertical cavity laser may be located in place of a BLM to facilitate electrical signaling.

Figure 12A:
FIGS. 12A and 12B illustrates, respectively, physical contact masks for metallizing plastic or elastomer buttons.
Figure 12B:
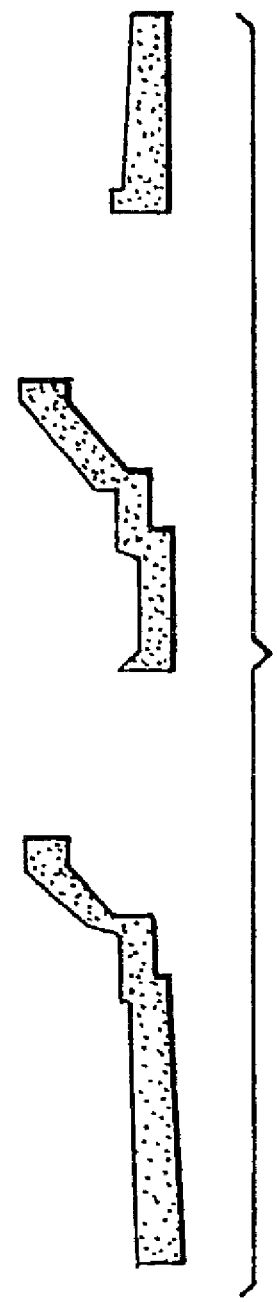

FIGS. 12A and 12B illustrate, schematically, sectional view of masked full metal shell buttons as shown in FIG. 12A with two button positions being represented; and which the mask forms the button type shown in FIG. 11G whereas in FIG. 12B the mask is provided to show a partially metallized button (two button positions being shown) wherein the mask corresponds to a cross-section of the button shown in FIG. 11A of the drawings.

Figure 13:
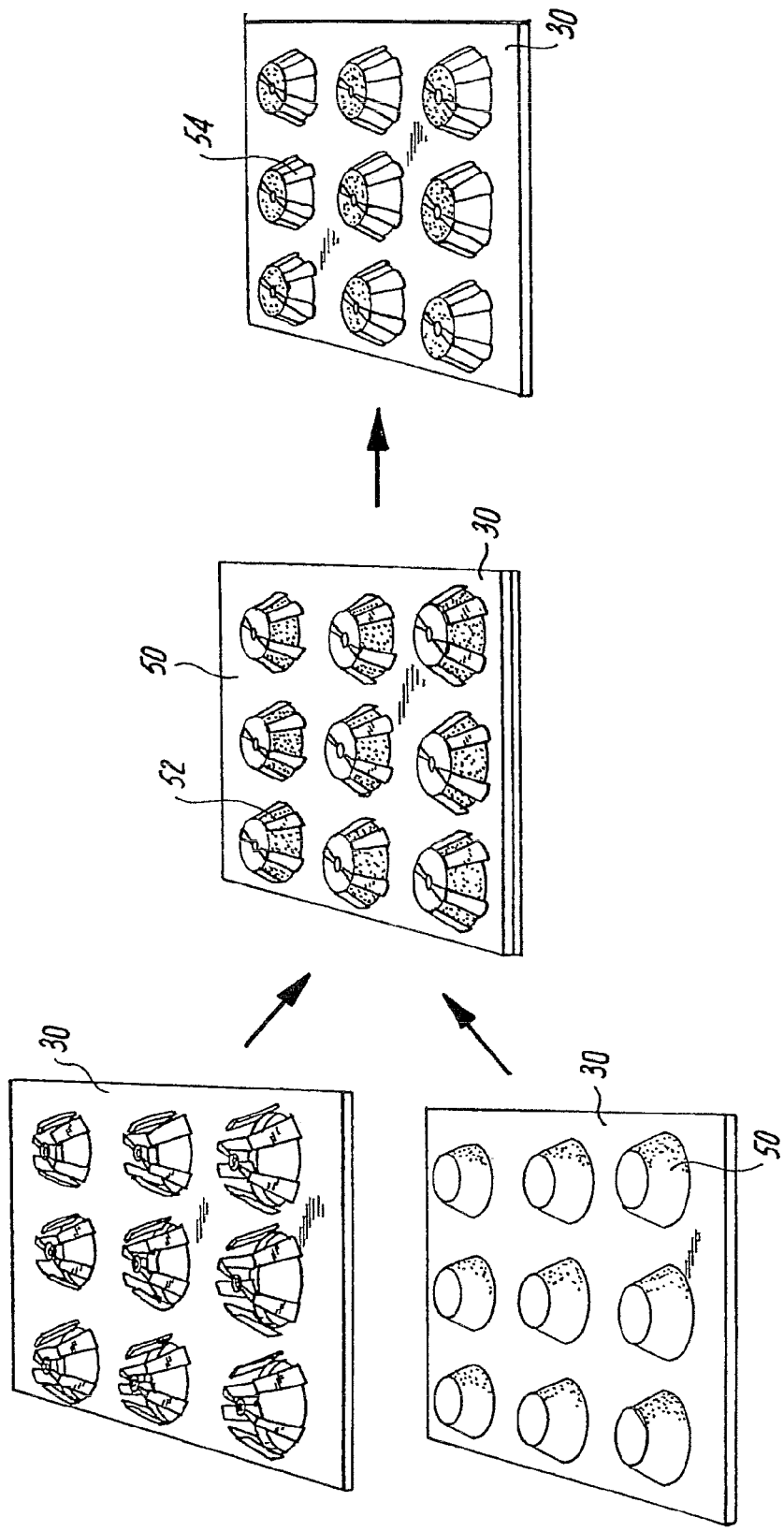
FIG. 13 illustrates the formation of the unmetallized interposer being brought into contact with physical masks prior to metallization and thereafter implementing the metallization, mask removal and remaining metallized interposer button structure.

In FIG. 13 there is illustrated the method as to how an unmetallized interposer button 50 is brought into a contact with a physical mask 52 prior to metallization. In that instance, a physical mask is applied, thereafter metallization is implemented and a mask lifted away to permit remaining of the metallized interposer buttons 50. In that case, the pattern is shown, by way of example of FIG. 11H which has the optical window provided therein in the form of a hole in the metallization pattern to permit light from a VCSEL to pass through to a detector.

In one instance, the mask 52 is shown in contact with the interposer, and in one case, the interposer with pure siloxane buttons. The evaporation or sputtering on of metal is followed by mask removal and a metallized interposer with ribs left non-metallized for stress relief, and a centerhole left unmetallized for optical connection as shown in FIG. 11H.

Figure 14A:
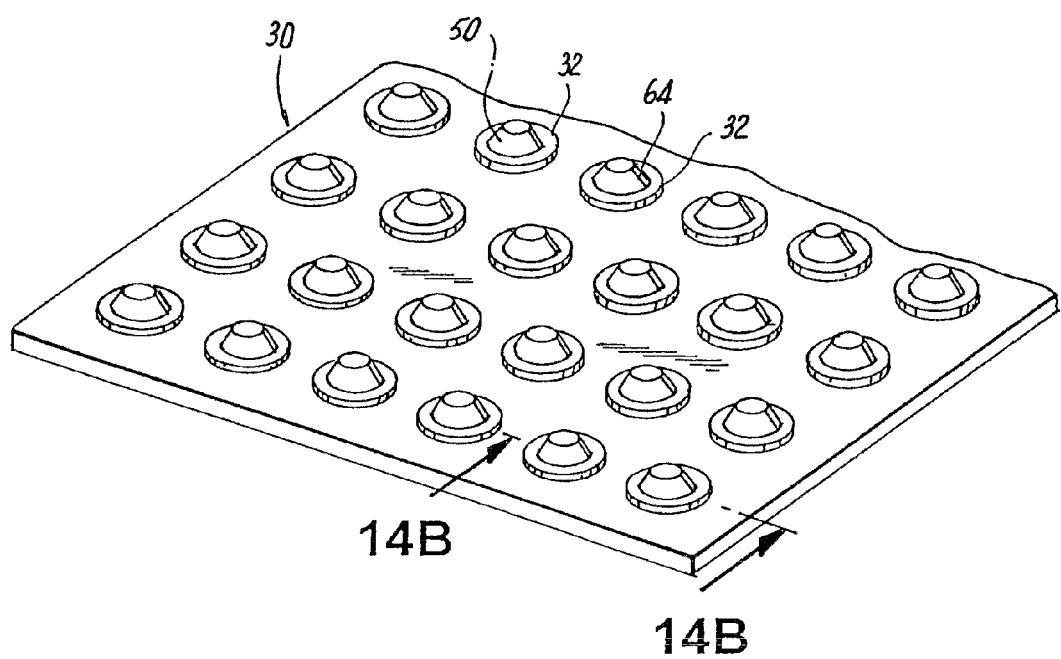
FIG. 14A illustrates a button cap pattern pursuant to FIG. 11G.
Figure 14B:
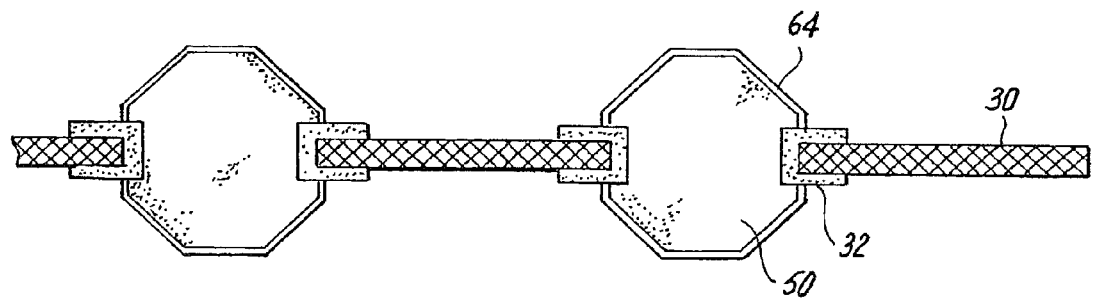
FIG. 14B illustrates, on an enlarged scale, a sectional view through two interposer contacts possessing full metal shells as caps.

As shown in FIGS. 14A and 14B there is illustrated a cap pattern pursuant to 11G if the all fabrication steps use a mask of the type shown in FIG. 12A, wherein in FIG. 14B there is shown a cross section of the interposers with two contacts illustrated which have full metal shells as caps.

Figure 15A:
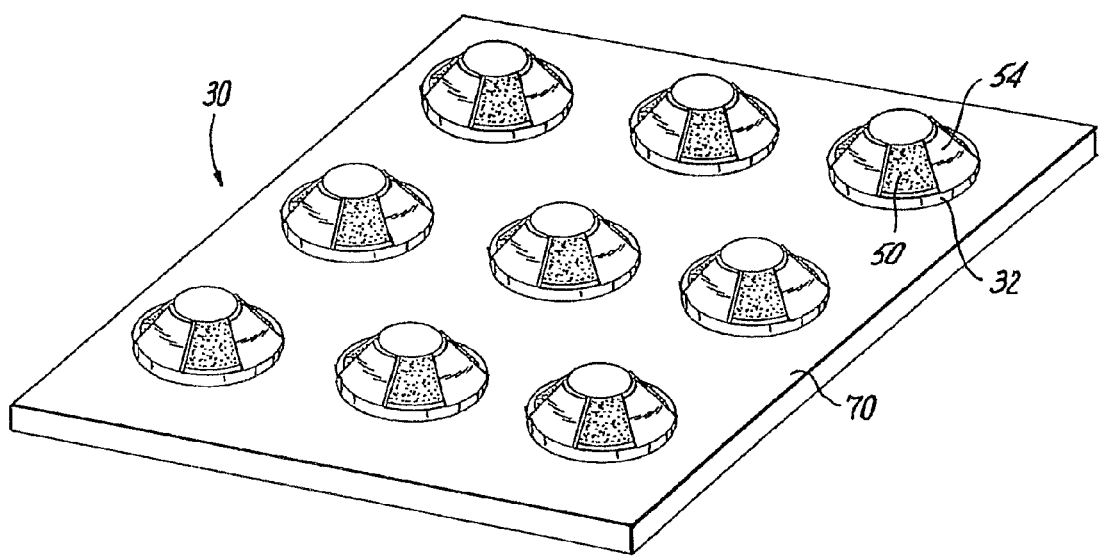
FIG. 15A illustrates an unmetallized array of siloxane LGA buttons docked into the physical mask with the pattern of FIG. 11B.
Figure 15B:
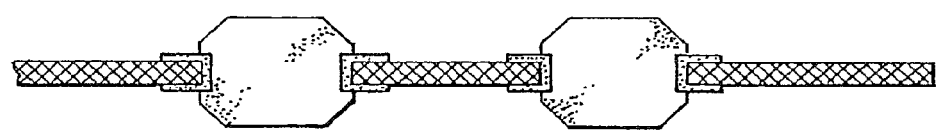
FIG. 15B illustrates, diagrammatically, a sectional view taken along the line 15B in FIG. 15A.

FIGS. 15A and 15B illustrate an unmetallized array of LGA buttons 50 which are docked into the physical mask 70 as corresponding to pattern of FIG. 11B; with FIG. 15B showing two of these in cross sectional view.

Figure 16:
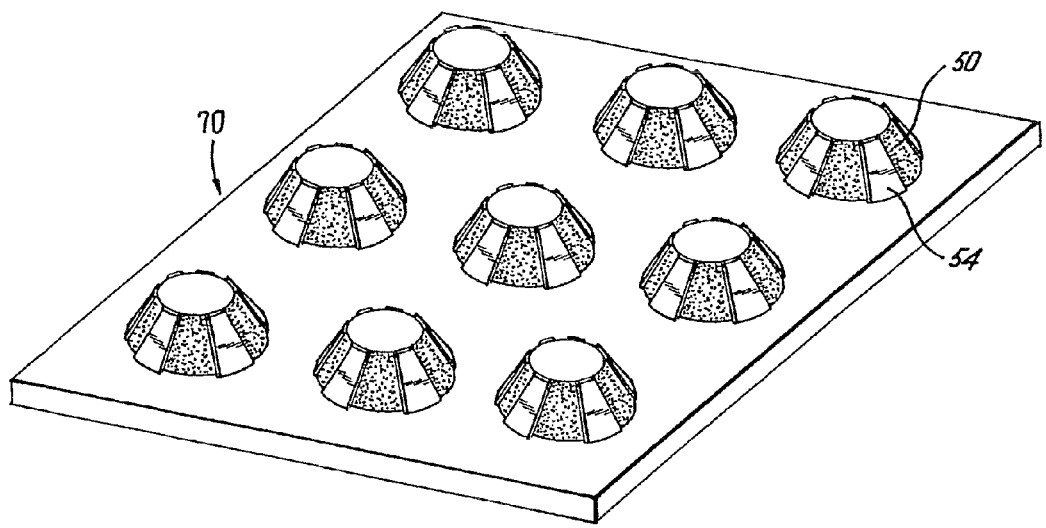
FIG. 16 illustrates an unmetallized array of siloxane LGA buttons which are docket into a physical mask having a pattern as shown in FIG. 11E.
Figure 17:
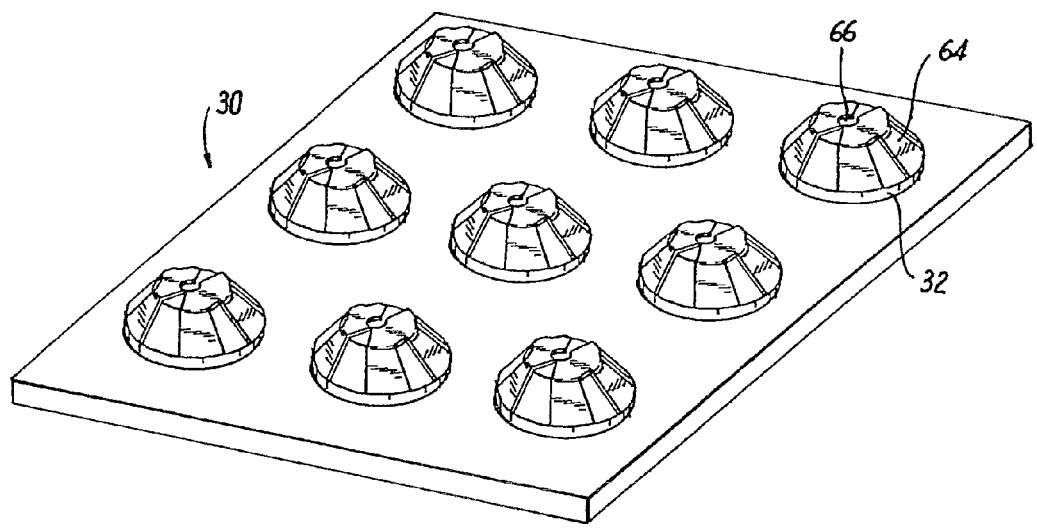
FIG. 17 illustrates a final version of an LGA interposer after fabrication employing the pattern of FIG. 11H.

In FIG. 16 there is illustrated an unmetallized array of siloxane LGA button which are docked into the physical mask corresponding the pattern of FIG. 11E; whereas FIG. 17 illustrates a final LGA interposer array after fabrication with a pattern similar to those of FIG. 11H, with a central hole for optical viewing.

Figure 18A:
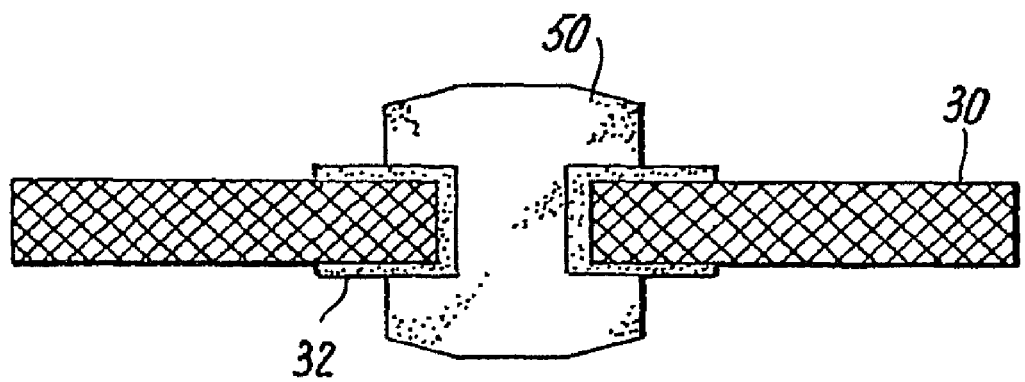
FIGS. 18A and 18B illustrate steps in a method for metallization of the elastomer buttons in a variation of FIG. 3, and to provide a metal shell as illustrated in FIG. 11G.
Figure 18B:
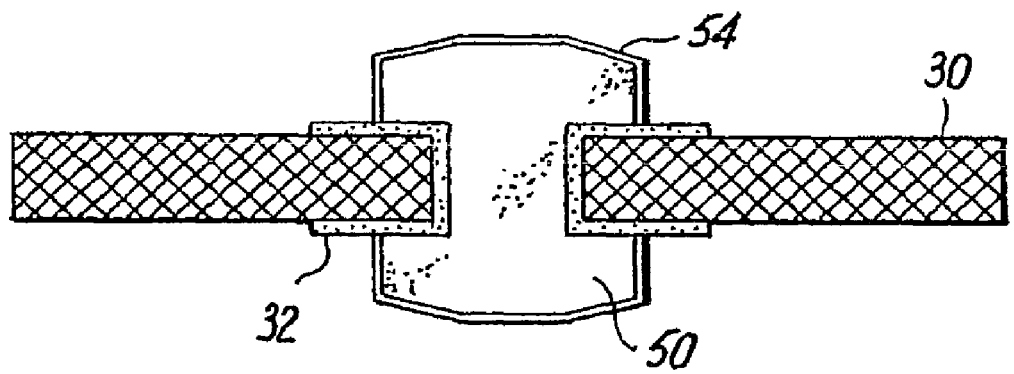

Finally, in FIGS. 18A and 18B there are illustrated steps in a method for metallization of the elastomer buttons, wherein electroless plating is employed using pre-seeded siloxane elastomer. No masks are required for full metal shell types as illustrated in FIG. 11G; and electroless plating using seed contained in the elastomer button is applied thereto.

From the foregoing, there is provided a simple method and arrangement of imparting metallization to the surface of these elastomer or resilient plastic interposer buttons in contrast to the internal metallization of the buttons as encountered in the prior art.

Description of Fabrication Methods

A land grid array interposer is fabricated to have a non-conducting polymer carrier plane which is perforated in a grid pattern. One hole for each contact button. Each hole is then metallized so that a continuous electrical path is formed from a concentric metal ring around the top surface of the hole, down through the via, and to a concentric ring around the bottom surface of the hole. These holes are then filled by injection molding to form barbell or otherwise shaped button contacts with elastomer. All contact buttons are made preferably simultaneously by injection molding of an elastomeric compound, such as for example siloxane rubber. This array of buttons is then metallized in any of several ways. The most straightforward method, constituting the preferred embodiment, utilizes a contact mask whereby the non-button areas of the LGA are protected by the mask, as are some select areas on the button. The metallization is carried out, for instance by vacuum sputtering, and then the mask removed. The metal covers only the desired portions of the contact button. The LGA is flipped over to the other side, the mask is applied, metallization of the second side carried out, and then the mask is again removed.

This provides an LGA interposer which has excellent conductivity from the top of the button to the bottom of the button, which is highly elastic, which has low restoring forces, and which does not suffer from the undesirable plastic deformation and creep of the filled elastomer systems of the prior art.

While this type of contact will have a large TCE (800 ppm) because of the pure elastomer button, it is of no consequence since the restoring force will be maintained at high levels throughout its use lifetime. It is only when restoring forces become diminished in the buttons of the prior art because of creep and stress relaxation that TCE pullback was of sufficient dimension to cause the undesirable transition from compression to open circuit.

An advantage to having a ribbed metal contact instead of a continuous shell, is that the stresses incurred during compression of the contact during use can be distributed away from the conducting metal and in doing so preserve the structural integrity of the button to higher contact loads and more extreme conditions. The uncontained elastomer between the conducting ribs can bulge out without inflicting damage or undue stresses to the conductors.

While the invention has been particularly shown and described with respect to preferred embodiments thereof, it will be understood by those skilled in the art that the foregoing and other changes in form and details may be made therein without departing from the spirit and scope of the invention.

What we claim is:

1. An interposer for a land grid array (LGA) forming an electrical interconnect structure between electronic components, said interposer comprising at least one generally pure dialectic elastic contact button essentially constituted of siloxane, and an electrically conductive material selected from the group of materials consisting of nickel, titanium alloy, copper or gold and other metals, and the electrically conductive material being disposed on the exterior of said at least one contact button providing said electrical interconnect, wherein said metal comprises an intermittent pattern of electrically-conductive material deposited on the external surface of said at least one elastic contact button, wherein said intermittent pattern is precluded from a center hole extending through the contact button to provide an optical window facilitating optical signal transmission therethrough.

* * * * *